(12) United States Patent
Nishimoto (10) Patent No.: US 11,427,909 B2
(45) Date of Patent: Aug. 30, 2022

(54) PLASMA PROCESSING APPARATUS

(71) Applicant: TOKYO ELECTRON LIMITED, Tokyo (JP)

(72) Inventor: Shinya Nishimoto, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 639 days.

(21) Appl. No.: 15/909,813

(22) Filed: Mar. 1, 2018

(65) Prior Publication Data

US 2018/0251895 A1 Sep. 6, 2018

(30) Foreign Application Priority Data

Mar. 3, 2017 (JP) .............. JP2017-040363

(51) Int. Cl.
*C23C 16/455* (2006.01)
*H01J 37/32* (2006.01)
*C23C 16/505* (2006.01)
*C23C 16/511* (2006.01)

(52) U.S. Cl.
CPC ...... *C23C 16/45536* (2013.01); *C23C 16/505* (2013.01); *C23C 16/511* (2013.01); *H01J 37/3222* (2013.01); *H01J 37/32192* (2013.01); *H01J 37/32522* (2013.01)

(58) Field of Classification Search
CPC ............ H01J 37/32; H01J 37/32009; H01J 37/32192; H01J 37/32201; H01J 37/32211; H01J 37/3222; H01J 37/32229; H01J 37/32238; H01J 37/32247; H01J 37/32256; H01J 37/32266; H01J 37/32311; H01J 37/32522; C23C 16/45563; C23C 16/511; C23C 16/455; C23C 16/45536; C23C 16/505; H05H 1/46; H05H 2001/4607; H05H 2001/4615; H05H 2001/4622; H05H 2001/463

See application file for complete search history.

(56) References Cited

U.S. PATENT DOCUMENTS

| | | | | |
|---|---|---|---|---|
| 5,154,943 | A * | 10/1992 | Etzkorn | C03C 17/001 118/723 MW |
| 5,870,526 | A * | 2/1999 | Aschner | C23C 16/4401 118/50.1 |
| 6,388,632 | B1 * | 5/2002 | Murakawa | H01J 37/32192 118/723 MW |
| 7,178,810 | B1 * | 2/2007 | Kuhary | E06B 7/2318 277/637 |

(Continued)

FOREIGN PATENT DOCUMENTS

JP 2015-173097 A 10/2015

*Primary Examiner* — Benjamin Kendall
*Assistant Examiner* — Kurt Sweely
(74) *Attorney, Agent, or Firm* — Fenwick & West LLP (57) ABSTRACT

In a plasma processing apparatus for generating a plasma in a processing space of a processing chamber and performing plasma processing on a target object, the apparatus includes an antenna configured to radiate a microwave for plasma generation into the processing chamber through a ceiling plate. The plasma processing apparatus further includes a pressing mechanism provided above the antenna and configured to press the antenna against the ceiling plate by a pressure of fluid supplied thereinto.

10 Claims, 4 Drawing Sheets

(56) References Cited

U.S. PATENT DOCUMENTS

| | | | |
|---|---|---|---|
| 8,006,640 B2 * | 8/2011 | Sasaki | H01L 21/0223 118/723 AN |
| 8,262,844 B2 * | 9/2012 | Ishikawa | C23C 16/511 156/345.1 |
| 2009/0301656 A1 * | 12/2009 | Nishimoto | H01J 37/32192 156/345.41 |
| 2014/0262034 A1 * | 9/2014 | Ishibashi | H01J 37/321 156/345.29 |
| 2015/0087162 A1 * | 3/2015 | Matsumoto | H01J 37/32192 438/798 |
| 2015/0194290 A1 * | 7/2015 | Nozawa | H01J 37/32715 156/345.34 |
| 2015/0232993 A1 * | 8/2015 | Iwao | C23C 16/45536 118/723 AN |
| 2016/0126066 A1 * | 5/2016 | Yoshikawa | H01J 37/32192 156/345.33 |

* cited by examiner

PLASMA PROCESSING APPARATUS

CROSS-REFERENCE TO RELATED APPLICATIONS

This application claims priority to Japanese Patent Application No. 2017-040363 filed on Mar. 3, 2017, the entire contents of which are incorporated herein by reference.

FIELD OF THE INVENTION

The present disclosure relates to a plasma processing apparatus for performing plasma processing on a target object such as a semiconductor wafer or the like.

BACKGROUND OF THE INVENTION

Conventionally, a plasma processing apparatus using a slot antenna is known as a plasma processing apparatus for performing predetermined plasma processing on a target object, e.g., a semiconductor wafer or the like. The slot antenna is provided on a dielectric window disposed at an opening of a ceiling surface of a processing chamber in a state where a wave retarder plate is mounted on a slot plate having a plurality of slots, and is connected to a coaxial waveguide at a central portion thereof. With this configuration, microwaves generated by a microwave generator are radially transmitted by the wave retarder plate via the coaxial waveguide. After circularly polarized waves are generated by the slot plate, the microwaves are radiated from the slot plate into the processing chamber through the dielectric window. A high-density plasma having a low electron temperature can be generated under a low pressure in the processing chamber by the microwaves, and plasma processing, e.g., film formation, etching or the like, is performed using the plasma thus generated.

As for the film formation, various processes using a microwave plasma such as plasma CVD (Chemical Vapor Deposition), PEALD (Plasma Enhanced ALD) and the like are known. For example, Japanese Patent Application Publication No. 2015-173097 discloses a technique for forming a desired thin film on a substrate by chemically adsorbing a precursor gas containing a component of a desired thin film to be formed on a substrate, removing an excessively adsorbed precursor gas by exposing the substrate to a purge gas, and exposing the substrate to a plasma of a reactant gas containing the component of the desired thin film to be formed.

A plasma processing apparatus for performing plasma processing such as the plasma CVD, the PEALD or the like may have various configurations. Among them, there is known a configuration in which a slot antenna (hereinafter, simply referred to as "antenna") includes a ceiling plate, a slot plate, a wave retarder plate and a cooling plate (referred to also as "cooling jacket") which is disclosed in Japanese Patent Application Publication No. 2015-173097.

In the technique disclosed in Japanese Patent Application Publication No. 2015-173097, the antenna has a configuration in which the cooling plate, the wave retarder plate, the slot plate and the ceiling plate are brought into close contact with one another by a pressing force from a pressing mechanism which uses a spring, e.g., a spiral spring gasket or the like (see, e.g., Japanese Patent Application Publication No. 2015-173097). This configuration enables stable propagation of the microwaves or the like.

However, in the plasma processing apparatus, due to a vacuum state in the processing chamber and high temperatures of the wave retarder plate and the antenna, the components such as the cooling plate, the wave retarder plate and the plate may be warped or deformed by heat. Therefore, a pressing load for bringing the components to be in close contact with one another varies and becomes non-uniform, which results in variation in adhesivity or the like. Further, the pressing load varies due to a heat cycle and a difference between plasma processing apparatuses having the same specification which is generated as time elapses. In the structure for bringing the ceiling plate and the antenna into close contact with each other by the pressing force using a spring or the like which is disclosed in Japanese Patent Application Publication No. 2015-173097, it is difficult to sufficiently deal with the variation of the load and the difference between the apparatuses having the same specification which is generated as time elapses. A gap may be generated due to the variation of the load, and this may lead to deviation of the microwaves. Further, it is difficult in a conventional technique to vary propagation characteristics of the microwaves by correcting a load or to control uniformity of processing.

SUMMARY OF THE INVENTION

In view of the above, the present disclosure provides a plasma processing apparatus capable of preventing variation of a load for close contact of various components such as a cooling plate, a wave retarder plate, a ceiling plate and the like in an antenna configuration of the plasma processing apparatus, easily setting and correcting a load with a simple structure, and minimizing variation of a load, a difference between apparatuses, temporal variation or the like.

In accordance with an aspect, there is provided a plasma processing apparatus for generating a plasma in a processing space of a processing chamber and performing plasma processing on a target object, the apparatus including: an antenna configured to radiate a microwave for plasma generation into the processing chamber through a ceiling plate; and a pressing mechanism provided above the antenna and configured to press the antenna against the ceiling plate by a pressure of fluid supplied thereinto.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
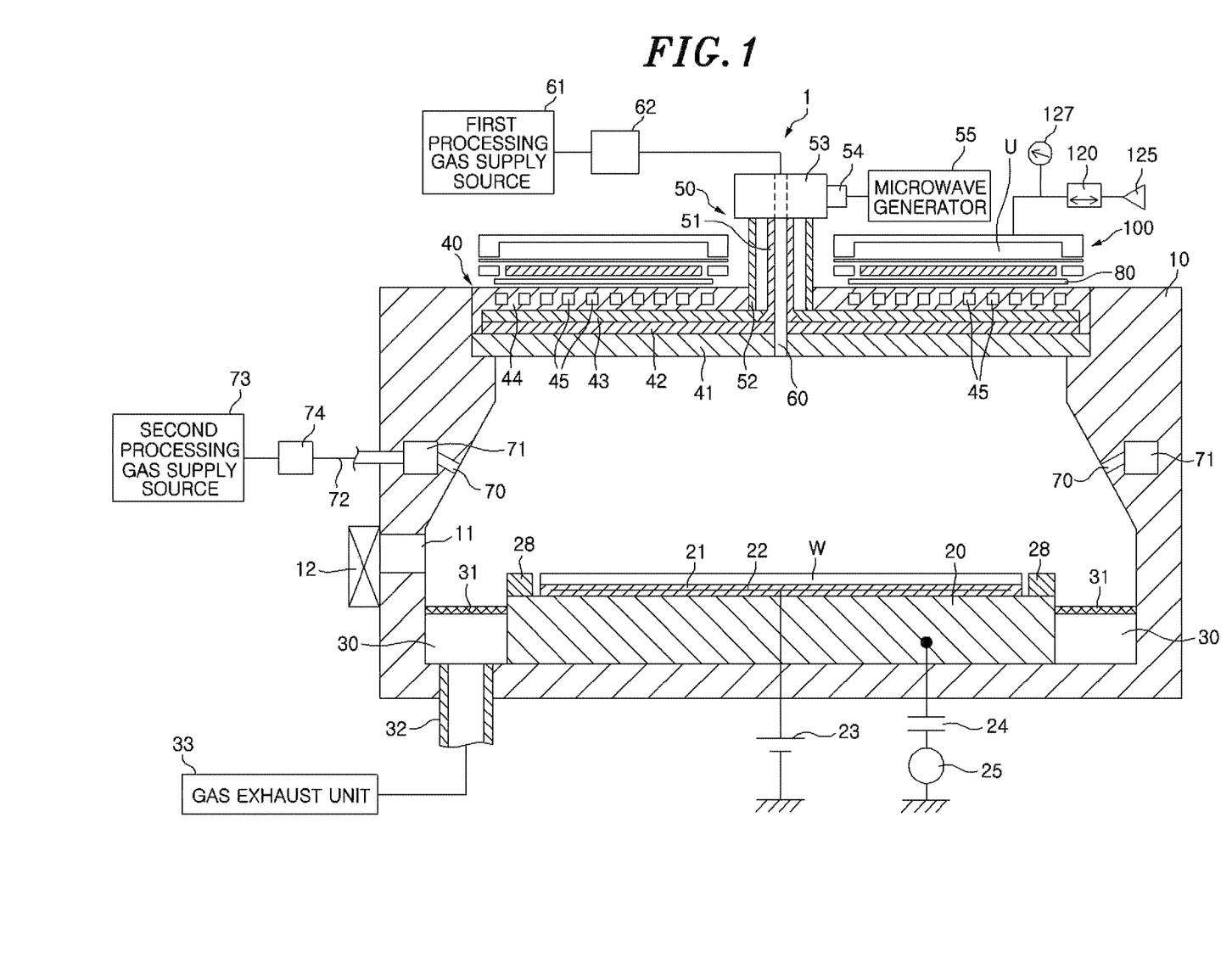
FIG. 1 is a schematic vertical cross sectional view showing a configuration of a plasma processing apparatus according to an embodiment.

Hereinafter, embodiments will be described with reference to the accompanying drawings. FIG. 1 is a schematic vertical cross sectional view showing a configuration of a plasma processing apparatus according to an embodiment.

In the present embodiment, the case in which a plasma processing apparatus 1 is configured as a film forming apparatus for performing plasm CVD (Chemical Vapor Deposition) on a surface (top surface) of a wafer W as a target object will be described as an example. Like reference numerals will be given to like parts having substantially the same functions throughout the specification and the drawings, and redundant description thereof will be omitted. The present disclosure is applicable to any apparatus for performing plasma processing on a target object by using a plasma. The present disclosure is not limited to the following embodiments.

As shown in FIG. 1, the plasma processing apparatus 1 includes a processing chamber 10. The processing chamber 10 is formed in a substantially cylindrical shape having an opening at a ceiling surface thereof. A slot antenna 40 (hereinafter, simply referred to as "antenna") to be described later is provided at the opening. A loading/unloading port 11 for a target object is formed on a side surface of the processing chamber 10. A gate valve 12 is provided at the loading/unloading port 11. An inner space of the processing chamber 10 can be airtightly sealed. The processing chamber 10 is made of a metal such as aluminum, stainless steel or the like. The processing chamber 10 is electrically grounded.

A cylindrical mounting table 20 for mounting thereon a wafer W is provided at a bottom portion in the processing chamber 10. The mounting table 20 is made of, e.g., AlN or the like.

An electrostatic chuck 21 is provided on a top surface of the mounting table 20. The electrostatic chuck 21 has a structure in which an electrode 22 is embedded in an insulating material. The electrode 22 is connected to a DC power supply 23 provided at an outside of the processing chamber 10. The wafer W can be attracted and held on the mounting table 20 by a Coulomb force generated on the surface of the mounting table 20 by the DC power supply 23.

An RF bias high frequency power supply 25 may be connected to the mounting table 20 via a capacitor 24. The high frequency power supply 25 outputs a high frequency power having a frequency, e.g., 13.56 MHz, suitable for controlling energy of ions attracted to the wafer W at a predetermined power level.

An annular focus ring 28 is provided on the top surface of the mounting table 20 to surround the wafer W on the electrostatic chuck 21. The focus ring 28 is made of an insulating material, e.g., ceramic, quartz or the like. The focus ring 28 is used for improving uniformity of the plasma processing.

Lifting pins (not shown) for lifting and supporting the wafer W from below the wafer W are provided to protrude and retract with respect to the top surface of the mounting table 20 while penetrating through through holes (not shown) formed in the mounting table 20.

An annular gas exhaust space 30 is formed between the mounting table 20 and the side surface of the processing chamber 10 to surround the mounting table 20. An annular baffle plate 31 having a plurality of gas exhaust holes is provided at an upper portion of the gas exhaust space 30 to uniformly exhaust the processing chamber 10. A gas exhaust line 32 is connected to a bottom surface of the processing chamber 10 which corresponds to a bottom portion of the gas exhaust space 30. The number of the gas exhaust line 32 may be arbitrarily set. A plurality of gas exhaust lines 32 may be formed along a circumferential direction. The gas exhaust line 32 is connected to a gas exhaust unit 33 having, e.g., a vacuum pump. The gas exhaust unit 33 can decrease a pressure in the processing chamber 10 to a predetermined vacuum level.

An antenna 40 for radiating and supplying a microwave for plasma generation and a ceiling plate 41 as a microwave transmitting plate are provided at the opening formed in the ceiling surface of the processing chamber 10. The antenna 40 includes a slot plate 42, a wave retarder plate 43 and a cooling jacket 44 (may be referred to as "cooling plate").

The ceiling plate 41 is airtightly provided at the opening formed at the ceiling surface of the processing chamber 10 through a sealing member (not shown), e.g., an O-ring or the like. Accordingly, the inner space of the processing chamber 10 is maintained in an airtight state. The ceiling plate 41 is made of a dielectric material, e.g., quartz, $Al_2O_3$, AlN or the like. The ceiling plate 41 transmits microwaves.

The slot plate 42 is provided on a top surface of the ceiling plate 41 opposite to the mounting table 20. The slot plate 42 has a plurality of slots and serves as an antenna. The slot plate 42 is made of a conductive material, e.g., copper, aluminum, nickel or the like.

The wave retarder plate 43 is provided on a top surface of the slot plate 42. The wave retarder plate 43 is made of a low loss dielectric material, e.g., quartz, $Al_2O_3$, AlN or the like. The slow-wave plate 43 shortens a wavelength of a microwave.

The cooling jacket 44 is provided on a top surface of the wave retarder plate 43 to cover the wave retarder plate 43 and the slot plate 42. A plurality of annular flow paths 45 through which a cooling medium, for example, circulates is formed in the cooling jacket 44. A heater 80 is provided on the top surface of the cooling jacket 44. The temperatures of the ceiling plate 41, the slot plate 42, the wave retarder plate 43 and the cooling jacket 44 are controlled to predetermined levels by the cooling medium flowing through the flow paths 45 and the temperature control of the heater 80.

Provided above the heater 80 is a pressing mechanism 100 for pressing the heater 80 and the cooling jacket 44 entirely or partially toward the wave retarder plate 43. The pressing mechanism 100 has an inner space U. The inner space U is connected with a load control unit 120 and a fluid supply source 125 that is a supply source of fluid introduced into the inner space U through the load control unit 120. A pressure gauge 127 for measuring a pressure of supplied fluid is provided. The configuration of the pressing mechanism 100 will be described later with reference to a schematic enlarged view shown in FIG. 2.

The pressing mechanism 100 can press the components, i.e., the slot plate 42, the wave retarder plate 43, the cooling jacket 44 and the heater 80, which may be deformed temporally or by heat when made of a metal, with appropriate load distribution toward the ceiling plate 41 and bring them into close contact with one another. Accordingly, the temperatures of the components can be appropriately controlled by the heater 80 and the cooling jacket 44.

A coaxial waveguide 50 is connected to a central portion of the cooling jacket 44. The coaxial waveguide 50 includes an inner conductor 51 and an outer tube 52. The inner conductor 51 is connected to the slot plate 42. A portion of the inner conductor 51 which is close to the slot plate 42 may have, e.g., a circular cone shape. With this configuration, the microwave can efficiently propagate through the slot plate 42.

A mode transducer 53 for converting a microwave to a predetermined vibration mode, a rectangular waveguide 54, and a microwave generator 55 for generating a microwave are connected to the coaxial waveguide 50 in that order from the coaxial waveguide 50 side. The microwave generator 55 generates a microwave having a predetermined frequency, e.g., 2.45 MHz.

With this configuration, the microwaves generated by the microwave generator 55 sequentially propagate through the rectangular waveguide 54, the mode transducer 53 and the coaxial waveguide 50 to be supplied into the antenna 40. Then, the microwaves are compressed by the wave retarder plate 43 such that the wavelength of the microwaves is shortened. After circularly polarized microwaves are generated by the slot plate 42, the microwaves are radiated from the slot plate 42 into the processing chamber 10 through the ceiling plate 41. A processing gas in the processing chamber 10 can be turned into a plasma by the microwaves, and the wafer W can be processed by the plasma thus generated.

A first processing gas supply line 60 serving as a processing gas supply unit is provided at a ceiling surface of the processing chamber 10, i.e., at a center portion of the antenna 40. The first processing gas supply line 60 penetrates through the antenna 40 so that one end of the first processing gas supply line 60 is opened at a bottom surface of the microwave transmitting plate 41. Further, the first processing gas supply line 60 penetrates through the inner conductor 51 of the coaxial waveguide 50 and then through the mode transducer 53 so that the other end of the first processing gas supply line 60 is connected to a first processing gas supply source 61. In the first processing gas supply source 61, TSA (trisilylamine), $N_2$ gas, $H_2$ gas and Ar gas are individually stored as processing gases. TSA, $N_2$ gas and $H_2$ gas are raw material gases for forming a SiN film, and Ar gas is a gas for plasma excitation. In the following description, the processing gas may be referred to as "first processing gas". A gas supply device group 62 including a valve, a flow rate controller or the like which controls the flow of the first processing gas is provided in the first processing gas supply line 60.

As shown in FIG. 1, a second processing gas supply line 70 serving as a second processing gas supply unit is provided at a side wall of the processing chamber 10. A plurality of, e.g., 24, second processing gas supply lines 70 is provided circumferentially at the side wall of the processing chamber 10 at equal intervals. One end of the second processing gas supply line 70 is opened at the inner surface of of the side wall of the processing chamber 10. The other end of the second processing gas supply line 70 is connected to a buffer unit 71. The second processing gas supply line 70 is inclined such that the one end thereof is positioned below the other end thereof.

The buffer unit 71 is formed in an annular shape in the side wall of the processing chamber 10 and commonly connected to the plurality of second processing gas supply lines 70. A second processing gas supply source 73 is connected to the buffer unit 71 through a gas supply line 72. In the second processing gas supply source 73, TSA (trisilylamine), $N_2$ gas, $H_2$ gas and Ar gas are individually stored as processing gases. In the following description, the processing gas may be referred to as "second processing gas". A gas supply device group 74 including a valve, a flow rate controller or the like which controls the flow of the second processing gas is provided in the gas supply line 72.

The first processing gas from the first processing gas supply line 60 is supplied toward a central portion of the wafer W. The second processing gas from the second processing gas supply line 70 is supplied toward an outer peripheral portion of the wafer W.

The first processing gas and the second processing gas respectively supplied from the first processing gas supply line 60 and the second processing gas supply line 70 into the processing chamber 10 may be the same type of gases or may be different types of gases. The first processing gas and the second processing gas may be supplied at independent flow rates or at any flow rate ratio.

In the above-described plasma processing apparatus 1 for forming, e.g., a SiN film, by performing plasma CVD on the surface of the wafer W as a target object, the pressing mechanism 100 presses the slot plate 42, the wave retarder plate 43, the cooling jacket 44 and the heater 80 against the ceiling plate 41 and brings those components into close contact with one another. The pressing mechanism 100 will be described in detail with reference to FIGS. 2 and 3.

Figure 2:
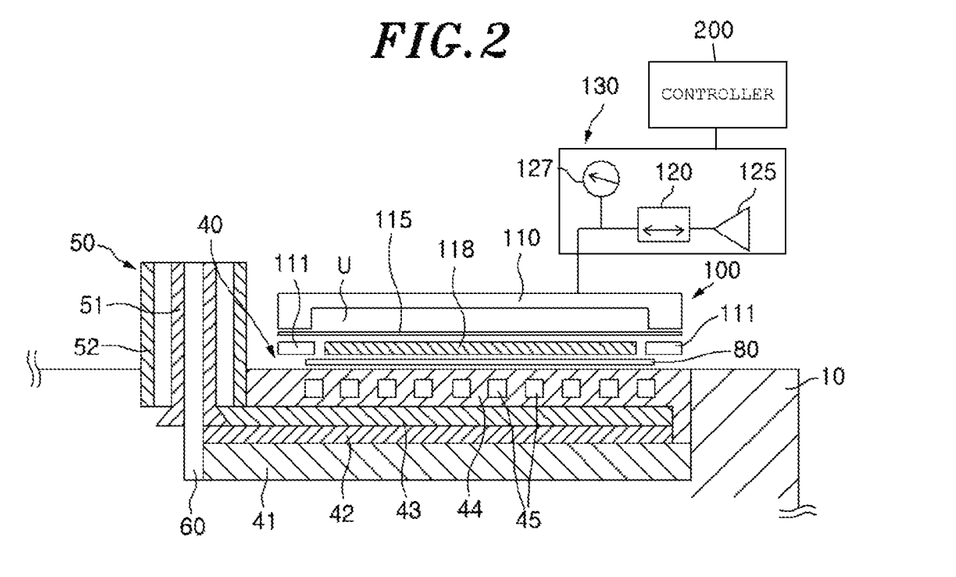
FIG. 2 schematically explains a pressing mechanism.

FIG. 2 is a partial enlarged view showing the vicinity of the pressing mechanism 100 of the plasma processing apparatus 1 and schematically explains the pressing mechanism 100. As shown in FIG. 2, the pressing mechanism 100 includes a fluid container 110 having an opening at a bottom side thereof, a film-shaped elastic body 115 serving as a diaphragm, and a ring member 111 for allowing the elastic body 115 to be fixed to the opening of the fluid container 110 to seal the inner space U of the fluid container 110.

A pressing member 118 is provided below the elastic body 115 and above the heater 80 (i.e., between the elastic body 115 and the heater 80). The elastic body 115 is, e.g., an expandable/contractible sheet, and formed by infiltrating rubber into fabric. The elastic body 115 is expanded by a pressure of fluid supplied into the fluid container 110 and a pressure in the inner space U is changed. The pressing member 118 is brought into contact with the elastic body 115 expanded by the inner space U exlared by the fluid supplied into the fluid container 110. The pressing load of the pressing member 118 varies depending on the amount of fluid supplied into the fluid container 110.

The pressing mechanism 100 is connected to a load control unit 120 for controlling a supply amount of fluid and a fluid supply source 125 as a supply source of fluid introduced into the inner space U through the load control unit 120. Here, the fluid is, e.g., air. The load control unit 120 can supply and suck the fluid to control a pressure (internal pressure) in the inner space U. The internal pressure of the inner space U is measured by the pressure gauge 127. The load control unit 120, the fluid supply source 125 and the pressure gauge 127 constitute a fluid supply mechanism 130. A controller 200 is connected to the fluid supply mechanism 130 to control supply and suction of the fluid. In the case of using a regulator as the load control unit 120, the controller 200 is not required and the internal pressure of the inner space U can be automatically controlled.

Figure 3:
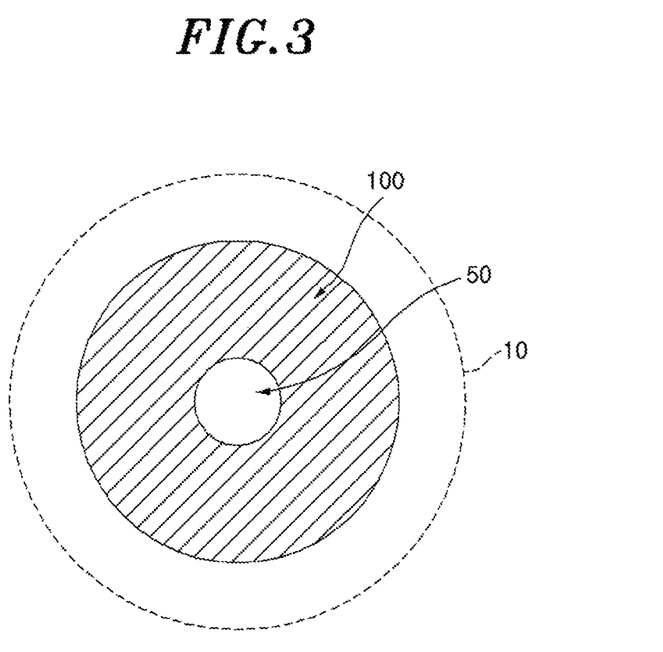
FIG. 3 is a schematic top view showing a shape of the pressing mechanism in the case of viewing the plasma processing apparatus from the top.

FIG. 3 is a schematic top view showing a shape of the pressing mechanism 100 in the case of viewing the plasma processing apparatus 1 from the top. As shown in FIG. 3, the pressing mechanism 100 has a substantially annular shape surrounding the coaxial waveguide 50 when viewed from the top and preferably covers the heater 80 and the cooling jacket 44. In other words, the pressing mechanism 100 preferably covers substantially entirely the slot plate, the wave retarder plate 43, the cooling jacket 44 and the heater 80 and is configured to vary/control a load for pressing those components against the ceiling plate 41.

The fluid container 110 and the ring member 111 are preferably made of a material having a strength enough to retain the fluid. For example, the fluid container 110 and the ring member 111 are made of aluminum. As for the elastic body 115, a sheet formed by infiltrating rubber into fabric or a sheet made of rubber may be used. The rubber is, e.g., fluorine rubber such as perfluoroelastomer (FFKM), fluoroelastomer (FKM) or the like, silicone rubber, NBR (nitrile rubber). Especially, when high heat resistance is required, it is preferable to use fluorine rubber such as FFKM, FKM or the like. The pressing member 118 is preferably made of an insulating material having low stiffness. For example, the pressing member 118 is made of, e.g., FKM, FFKM, foam resin or the like.

In the above-described plasma processing apparatus 1 of the present embodiment, the pressing mechanism 100 and the pressing member 118 are provided above the ceiling plate 41 so that the slot plate 42, the wave retarder plate 43, the cooling jacket 44 and the heater 80 are disposed therebetween (see FIGS. 1 and 2). With this configuration, the pressure (internal pressure) can be controlled by supplying fluid such as air or the like from the fluid supply source 125 into the inner space U of the fluid container 110, and the pressing member 118 can be pressed toward the ceiling plate 41 by the expansion of the elastic body 115. When the pressing member 118 is pressed, the heater 80, the cooling jacket 44, the wave retarder plate 43 and the slot plate 42 are pressed against the ceiling plate 41 and, thus, stable fixation is obtained. At this time, since the pressing load depends on the pressing of the pressing member 118 which is affected by the pressure (internal pressure) of the fluid, a problem of non-uniform pressing load and a problem of temporal variation of the pressing load which is caused by a heat cycle or the like do not occur. Further, since the pressing load depends on the pressure of the fluid, there is no difference between plasma processing apparatuses.

In other words, the supply of fluid in the pressing mechanism 100 ensures close contact of the components such as the heater 80, the cooling jacket 44, the wave retarder plate 43 and the slot plate 42. Further, a pressing load for close contact of those components and the ceiling plate 41 can be arbitrarily set and a uniform pressing load can be obtained. In addition, it is possible to suppress the variation of the pressing load and easily correct (finely control) the pressing load by the supply amount of the fluid. An inner volume of the fluid container 110 in the pressing mechanism 100 may be arbitrarily set. Since, however, the fluid container 110 does not require a large inner volume, the inner volume thereof may be set appropriately depending on an installation cost and an installation space. In other words, a minimum inner volume for generating a pressure by using fluid is required and, thus, the mechanism can become compact.

While the exemplary embodiment of the present disclosure has been described, the present disclosure is not limited to the illustrated embodiment. It is obvious to those skilled in the art that various changes or modifications can be made within the scope of the appended claims, and such changes and modifications are also included in the technical scope of the present disclosure.

Other Embodiments

For example, in the above embodiment, one pressing mechanism 100 is installed at the plasma processing apparatus 10 and the pressing mechanism 100 has a substantially annular shape surrounding the coaxial waveguide 50 when viewed from the top. However, the shape and the configuration of the pressing mechanism 100 of the present disclosure are not limited thereto. Hereinafter, other shapes and other configurations of the pressing mechanism 100 according to other embodiments will be briefly described with reference to the drawings.

Figure 4A:
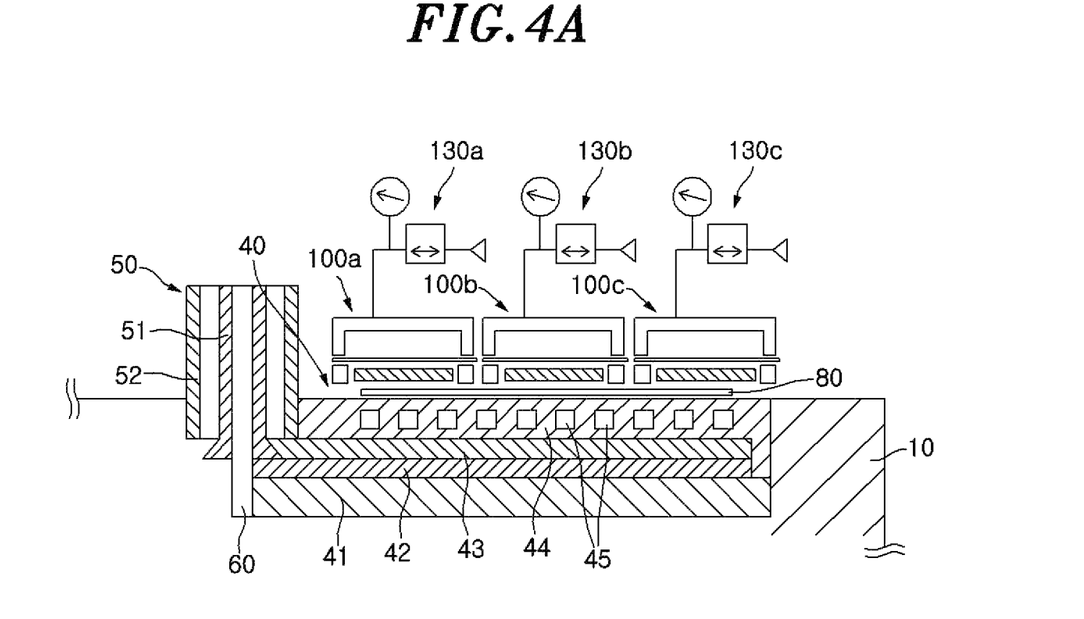
FIGS. 4A and 4B schematically explain another shape of the pressing mechanism.
Figure 4B:
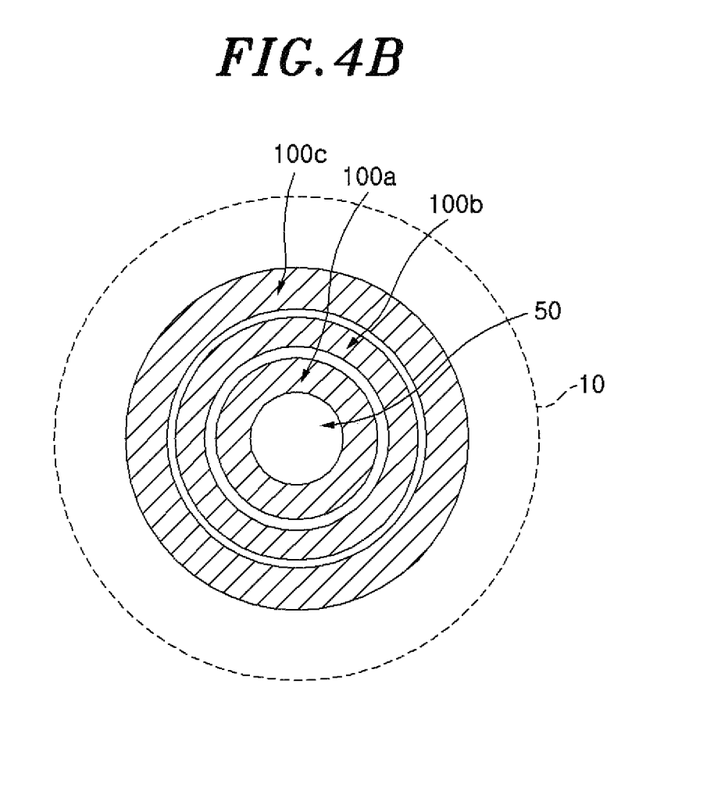
Figure 5:
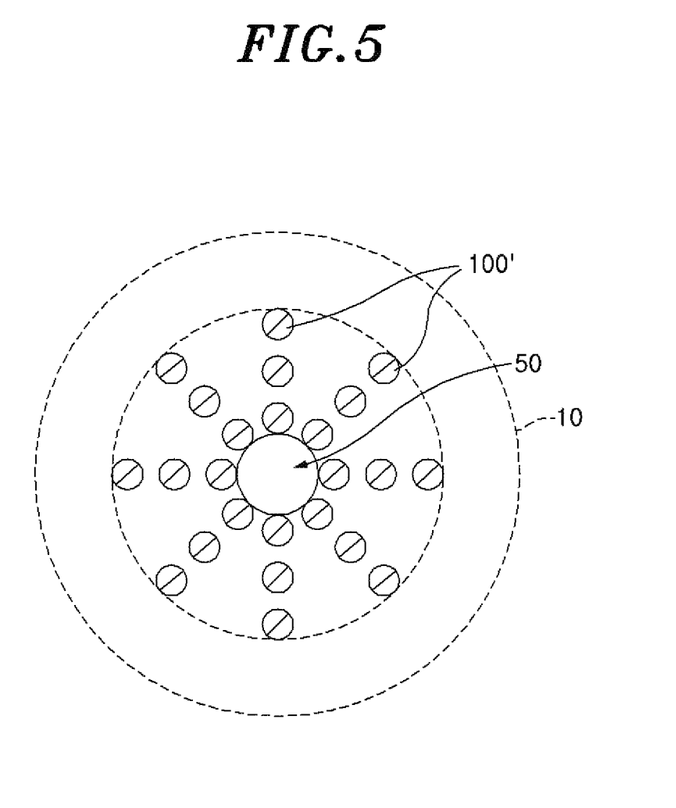
FIG. 5 is a schematic top view showing a modification of the pressing mechanism.

FIGS. 4A and 4B schematically explain another shape of the pressing mechanism 100. FIG. 4A is a schematic side sectional view showing the vicinity of the pressing mechanism. FIG. 4B is a schematic top view showing the vicinity of the pressing mechanism. In FIGS. 4A and 4B and FIG. 5 to be described later, like reference numerals will be given to like parts having substantially the same functions as those in the above embodiment (FIGS. 1 to 3), and redundant description thereof will be omitted.

As shown in FIGS. 4A and 4B, the pressing mechanism 100 of the present embodiment includes three substantially annular pressing mechanisms 100a to 100c arranged concentrically about the coaxial waveguide 50 when viewed from the top. The pressing mechanisms 100a to 100c have different diameters and are arranged in that order from the inner side. The pressing mechanisms 100a to 100c are separately provided and the supply of fluid into inner spaces thereof is individually controlled by fluid supply units 130a to 130c, respectively. In other words, each of the pressing mechanisms 100a to 100c can separately control the pressing load applied to the heater 80, the cooling jacket 44, the wave retarder plate 43 and the slot plate 42.

In the pressing mechanisms 100a to 100c according to another embodiment which is shown in FIGS. 4A and 4B, the adhesion between the components and between the components and the ceiling plate 41 may be changed on a region basis by changing the pressing load applied by each of the pressing mechanisms 100a to 100c to the heater 80, the cooling jacket 44, the wave retarder plate 43 and the slot plate 42. Accordingly, the propagation characteristics of the microwaves in each region can be changed and proper microwave distribution can be realized.

For example, in the case of making the pressing load of the pressing mechanism 100a greater than the pressing load of the pressing mechanism 100c, the adhesion between the components and between the components and the ceiling plate 41 becomes greater at a central region (near the coaxial waveguide 50) of the plasma processing apparatus 1 than at a region far from the central region, i.e., far from the coaxial waveguide 50. Accordingly, the propagation of the microwaves at the central region of the plasma processing apparatus 1 can be promoted. Since the adhesivity between the components and between the components and the ceiling plate 41 can be controlled, the film formation distribution (film formation uniformity) in forming a film by plasma processing can also be controlled.

FIG. 5 is a schematic top view showing another modification of the pressing mechanism 100. As shown in FIG. 5, pressing mechanisms 100' according to a modification are arranged when viewed from the top. The locations of the pressing mechanisms 100' are arbitrarily determined. FIG. 5 illustrates a configuration in which twenty-four pressing mechanisms 100', each having a considerably small diameter, are arranged radially (on a plurality of concentric circles) about the coaxial waveguide 50. The pressing mechanisms 100' are preferably connected to individual fluid supply units (not shown in FIG. 5), respectively. Accordingly, the pressing loads of the pressing mechanisms 100' can be independently controlled.

In this modification, it is possible to finely adjust non-uniform pressing load and non-uniform adhesion, which occur locally due to thermal deformation (deformation caused by residual stress) of the antenna structure of the plasma processing apparatus 1 and various structural reasons, to obtain uniform pressing load and uniform adhesion.

In the above embodiment, the configuration in which the pressing member 118 is installed between the heater 80 and the elastic body 115 of the pressing mechanism 110 has been described. However, the pressing member 118 is not necessarily required to ensure stable adhesion between the components such as the heater 80, the cooling jacket 44, the wave retarder plate 43 and the slot plate 42 and between the components and the ceiling plate 41. In other words, the pressing load can be controlled and the stable adhesivity can be obtained by direct contact between the elastic body 115 and the heater 80 or the like. In that case, the elastic body 115 requires high heat resistance.

In the above embodiment, the configuration in which the microwave generator 55 and the coaxial waveguide 50 are provided at one location (center) of the apparatus has been illustrated and described (see FIG. 1) as an exemplary configuration of the plasma processing apparatus 10. However, the present disclosure is not limited thereto. For example, the same load control technique using the pressing mechanism can also be applied to a configuration in which the microwave generator, the coaxial waveguide and the like are provided at a plurality of locations of the plasma processing apparatus.

The film forming apparatus for performing plasma CVD on the surface of the wafer W has been described as the plasma processing apparatus 1 of the above embodiment. However, the plasma processing apparatus to which the technique of the present disclosure is applied is not limited thereto, and the technique of the present disclosure may be applied to a processing apparatus for performing various processes using a microwave plasma, e.g., PEALD (plasma enhanced atomic layer deposition) and the like.

The present disclosure may be applied to a plasma processing apparatus for performing plasma processing on a target object such as a semiconductor or the like.

While the present disclosure has been shown and described with respect to the embodiments, it will be understood by those skilled in the art that various changes and modifications may be made without departing from the scope of the present disclosure as defined in the following claims.

What is claimed is:

1. A plasma processing apparatus for generating a plasma in a processing space of a processing chamber and performing plasma processing on a target object, the apparatus comprising:
    an antenna configured to radiate a microwave for plasma generation into the processing chamber through a ceiling plate; and
    a pressing mechanism provided above the antenna, wherein the pressing mechanism includes a rigid fluid container having an opening at a bottom side thereof to face the antenna, and a film-shaped expandable and contractible elastic body fixed to the opening to seal an inner space of the rigid fluid container, the rigid fluid container in conjunction with the elastic body defining the inner space;
    a fluid supply unit connected to the inner space defined by the rigid fluid container and the elastic body and configured to supply fluid of a predetermined pressure to the inner space, wherein the fluid supply unit includes a fluid supply source, a pressure gauge for measuring an internal pressure of the inner space and a load control unit for controlling a supply amount of the fluid, and the load control unit is provided between the fluid supply source and the inner space; and
    a controller configured to:
        control the fluid supply unit to supply the fluid from the fluid supply source into the inner space through the load control unit, and
        control the elastic body to press the antenna against the ceiling plate by a pressure of the fluid supplied into the inner space of the rigid fluid container, wherein a pressing load is applied to the elastic body by supplying the fluid from the fluid supply unit into the inner space of the rigid fluid container.

2. The plasma processing apparatus of claim 1, further comprising a pressing member provided between the antenna and the pressing mechanism, wherein the pressing member is pressed by the pressing load applied to the elastic body to press the antenna.

3. The plasma processing apparatus of claim 2, further comprising a heater provided between the antenna and the pressing member.

4. The plasma processing apparatus of claim 2, wherein the elastic body is made of any one of fluorine rubber, silicone rubber or nitrile rubber.

5. The plasma processing apparatus of claim 2, wherein the pressing mechanism further includes at least one additional rigid fluid container and a corresponding elastic body, and
    the fluid supply unit is provided for each of the rigid fluid container and the at least one additional rigid fluid container to be independently controllable.

6. The plasma processing apparatus of claim 5, wherein the rigid fluid containers, the elastic body, the at least one additional rigid fluid container and the corresponding elastic body are arranged concentrically about a central vertical axis of the plasma processing apparatus when viewed in a plan view.

7. The plasma processing apparatus of claim 5, wherein the rigid fluid container, the elastic body, the at least one additional rigid fluid container and the corresponding elastic body are arranged on a plurality of concentric circles about a central vertical axis of the plasma processing apparatus when viewed in a plan view.

8. The plasma processing apparatus of claim 5, further comprising an additional pressing member for each of the at least one additional rigid fluid container and the elastic body.

9. The plasma processing apparatus of claim 1, wherein the fluid is air.

10. The plasma processing apparatus of claim 2, wherein the antenna includes a cooling plate and the pressing member is provided between the cooling plate and the elastic body.

* * * * *